(12) United States Patent
Badack et al.

(10) Patent No.: US 11,556,412 B2
(45) Date of Patent: Jan. 17, 2023

(54) PROCESSING OF DATA

(71) Applicant: Infineon Technologies AG, Neubiberg (DE)

(72) Inventors: Christian Badack, Unterhaching (DE); Jessica Trebst, Potsdam (DE); Michael Goessel, Mahlow (DE); Klaus Oberlaender, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 127 days.

(21) Appl. No.: 16/663,839

(22) Filed: Oct. 25, 2019

(65) Prior Publication Data
US 2020/0133763 A1 Apr. 30, 2020

(30) Foreign Application Priority Data
Oct. 25, 2018 (DE) .......................... 102018126685.5

(51) Int. Cl.
*G06F 11/10* (2006.01)
*G06F 9/38* (2018.01)
(Continued)

(52) U.S. Cl.
CPC .......... *G06F 11/102* (2013.01); *G06F 9/3861* (2013.01); *G06F 11/1028* (2013.01); *G06F 11/1048* (2013.01); *H03M 13/13* (2013.01); *H03M 13/155* (2013.01); *H03M 13/1525* (2013.01); *H03M 13/616* (2013.01)

(58) Field of Classification Search
CPC .. G06F 11/102; G06F 9/3861; G06F 11/1028; G06F 11/1048; G06F 11/1004; H03M 13/13; H03M 13/155; H03M 13/1525; H03M 13/616
See application file for complete search history.

(56) References Cited

U.S. PATENT DOCUMENTS 8,875,002 B1 10/2014 Dutta
10,176,040 B2 1/2019 Kreifels
(Continued)

FOREIGN PATENT DOCUMENTS

TW 201732592 A 9/2017
TW I627634 B 6/2018

OTHER PUBLICATIONS

Rao, T. R. N.,Fujiwara, E.; "Error-Control Coding for Computer Systems"; Prentice Hall, 1989; S. 97-99; ISBN 0-13-283953-9.
(Continued)

*Primary Examiner* — Thien Nguyen
(74) *Attorney, Agent, or Firm* — Eschweiler & Potashnik, LLC

(57) ABSTRACT

A method and associated apparatus is disclosed for processing data by means of an error code, wherein the error code has an H-matrix with n columns and m rows, wherein the columns of the H-matrix are different, wherein component-by-component XOR sums of adjacent columns of the H-matrix are different from one another and from all columns of the H-matrix and wherein component-by-component XOR sums of nonadjacent columns of the H-matrix are different from all columns of the H-matrix and from all component-by-component XOR sums of adjacent columns of the H-matrix.

18 Claims, 1 Drawing Sheet

(51) Int. Cl.
      *H03M 13/00*     (2006.01)
      *H03M 13/15*     (2006.01)
      *H03M 13/13*     (2006.01)

(56)            References Cited

U.S. PATENT DOCUMENTS

| | | |
|---|---|---|
| 10,268,539 B2 | 4/2019 | Wu et al. |
| 2007/0214403 A1 | 9/2007 | Longwell et al. |
| 2013/0305119 A1 | 11/2013 | Kern et al. |
| 2016/0266959 A1* | 9/2016 | Cuffney ............... G06F 17/16 |
| 2017/0063394 A1* | 3/2017 | Halbert ............... G06F 3/064 |
| 2018/0203761 A1* | 7/2018 | Halbert ............. G06F 11/1012 |

OTHER PUBLICATIONS https://de.wikipedia.org/wiki/BCHCode ; "BCH-CODE"; Apr. 26, 2018.

* cited by examiner

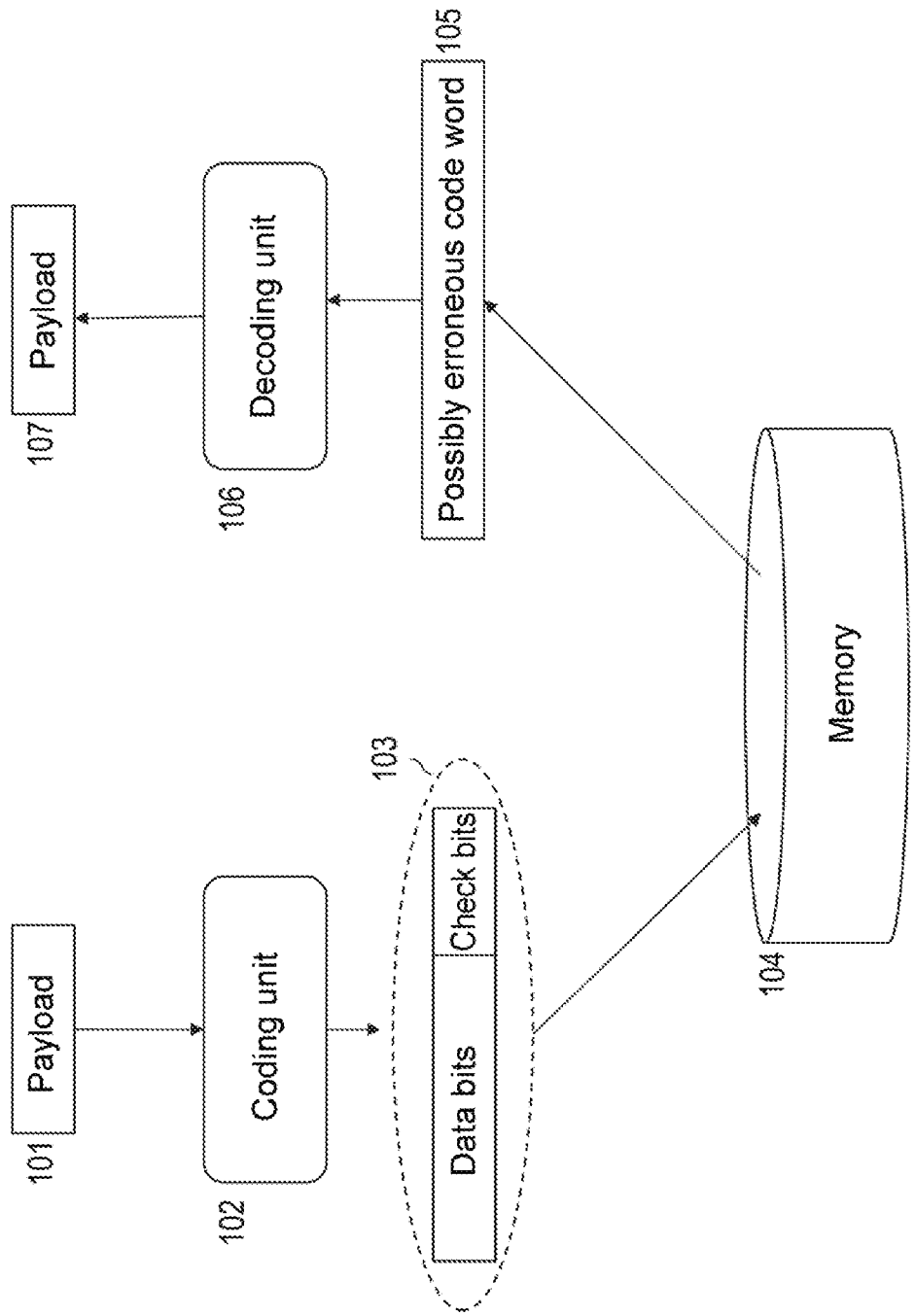

PROCESSING OF DATA

REFERENCE TO RELATED APPLICATION

This Application claims priority to German Application No. 10 2018 126 685.5, filed on Oct. 25, 2018, the contents of which are hereby incorporated by reference in their entirety.

FIELD

The processing of data that is mentioned here relates in particular to the error detection and error correction of data stored in a memory.

SUMMARY

This disclosure improves existing approaches to error correction and/or error detection of data stored in a memory.

In one embodiment, a method is proposed for processing data by means of an error code, wherein the error code has an H-matrix with n columns and m rows,
wherein the columns of the H-matrix are different,
wherein component-by-component XOR sums of adjacent columns of the H-matrix are different from one another and from all columns of the H-matrix, and
wherein component-by-component XOR sums of nonadjacent columns of the H-matrix are different from all columns of the H-matrix and from all component-by-component XOR sums of adjacent columns of the H-matrix.

In one embodiment, it is in particular advantageous that a processing speed for correcting and detecting errors can be significantly increased in comparison with known solutions.

One embodiment is that a number of all components of a column is less than the smallest whole number that is greater than $2 \cdot \log 2\, n$.

One embodiment is that the error code is an error-detecting or an error-correcting and error-detecting code.

One embodiment is that at least two component-by-component XOR sums of nonadjacent columns of the H-matrix are not different.

One embodiment is that the error code has a length of n bits with m check bits and n-m payload bits.

One embodiment is that the error code is used
to correct 1-bit errors,
to correct adjacent 2-bit errors, and
to detect nonadjacent 2-bit errors.

One embodiment is that a syndrome generator for forming an m-component error syndrome is determined in accordance with the H-matrix.

One embodiment is that the syndrome generator is implemented as a combinatorial circuit having n inputs and m outputs.

One embodiment is that there is provision for a correction value formation circuit or unit that uses the m-component error syndrome provided by the syndrome generator to form correction values for erroneous bit positions.

One embodiment is that $n \geq 2m/2$.

One embodiment is that the H-matrix is part of an extended H-matrix.

One embodiment is that the extended H-matrix is determined as follows:
the H-matrix is duplicated into an original H-matrix and a duplicate H-matrix, wherein an intermediate column having m zeroes is inserted between the original H-matrix and the duplicate H-matrix,
the original H-matrix has two rows having n zeroes added to it,
the duplicate H-matrix has one row having n ones and a further row added to it, wherein the further row is determined by
a bit combination comprising n bits according to 1010 . . . 10, if n is even-numbered, or
a bit combination comprising n bits according to 1010 . . . 1, if n is odd-numbered, and
the intermediate column comprising m zeroes has one column $[0,1]^T$ added to it.

One embodiment is that the H-matrix is adapted by deleting at least one first and/or at least one last column.

One embodiment is that the H-matrix is modified by a linear combination of its rows.

One embodiment is that the processing of the data comprises writing to a memory or reading from a memory.

Furthermore, an apparatus is proposed for processing data by means of an error code, wherein the error code has an H-matrix with n columns and m rows, wherein the apparatus comprises a processing circuit or unit that is configured to determine the error code by way of the H-matrix,
wherein the columns of the H-matrix are different,
wherein component-by-component XOR sums of adjacent columns of the H-matrix are different from one another and from all columns of the H-matrix, and
wherein component-by-component XOR sums of nonadjacent columns of the H-matrix are different from all columns of the H-matrix and from all component-by-component XOR sums of adjacent columns of the H-matrix.

The processing circuit or unit mentioned here may be embodied in particular as a processor unit and/or an at least partially hardwired or logic circuit arrangement that is configured for example such that the method as described herein is performable. The processing circuit or unit can be or comprise any type of processor or calculator or computer having accordingly necessary peripherals (memory, input/output interfaces, input/output devices, etc.).

One embodiment is that the processing circuit or unit comprises a syndrome generator that outputs syndromes on the basis of the H-matrix.

One embodiment is that the apparatus comprises a memory or is couplable to a memory, wherein the processing of the data comprises writing to the memory or reading from the memory.

One embodiment is that a number of all components of a column is less than the smallest whole number that is greater than $2 \cdot \log 2\, n$.

One embodiment is that at least two component-by-component XOR sums of nonadjacent columns of the H-matrix are not different.

The above explanations relating to the method apply to the apparatus accordingly. The apparatus may be embodied in one circuit or component or in a manner distributed in multiple circuits or components.

The aforementioned functionality is also achieved by means of a system comprising at least one of the apparatuses described here.

Furthermore, a non-transitory computer program product is proposed that is loadable directly into a memory of a digital computer, comprising program code parts suitable for performing steps of the method described here.

A non-transitory computer-readable storage medium is also specified comprising computer-executable instructions suitable for the computer to perform steps of the method described here.

BRIEF DESCRIPTION OF THE DRAWINGS

The properties, features and advantages of this disclosure that are described above and the way in which they are achieved are described below in connection with a schematic description of exemplary embodiments that are explained more specifically in connection with the drawing, in which:

FIG. 1 shows an exemplary arrangement to illustrate the processing of data by means of error codes.

DETAILED DESCRIPTION

When storing data in memory cells of a memory and when reading from the memory, errors can occur. The data stored in the memory can also become distorted. By way of example, the memory may be exposed to radiation (e.g. from space or terrestrial radiation) that distorts the content of memory cells, in particular the content of adjacent memory cells.

As such, the error occurring may be a 1-bit error that distorts 1 bit in a memory cell. Accordingly, a 2-bit error distorts two memory cells.

Memory cell errors in two adjacent memory cells can occur more frequently in this case than memory cell errors in two memory cells that are not adjacent.

To achieve the most reliable storage of data possible in a memory while at the same time making little effort, it is for example an aim

- to correct memory cell errors in one memory cell,
- to correct memory cell errors in two adjacent memory cells, and
- to reliably detect memory cell errors in two nonadjacent memory cells, and to need as few memory cells having check bits as possible for this.

If data are read from the memory and a read datum from one memory cell is erroneous, then this is a 1-bit error. If there are two errors in two adjacent memory cells, then this is an adjacent 2-bit error. If there are two errors in two nonadjacent memory cells, this is consistent with a nonadjacent 2-bit error.

By using an error code, a solution is provided that is used to correct 1-bit errors and adjacent 2-bit errors, and to detect nonadjacent 2-bit errors. It is in particular an option for corrigible errors to be detected (before correction).

It may be advantageous that rarely occurring nonadjacent 2-bit errors are detected (and not corrected), but more often occurring adjacent 2-bit errors are detected and corrected, since fewer check bits are needed in such a scenario than for correcting all (including nonadjacent) 2-bit errors.

The error code referred to can be an error-correcting and/or error-detecting code.

The data to be stored can be stored in the memory in a manner coded as codewords of the error code. By way of example, the data to be stored can comprise data bits that have check bits added to them, so that the data bits and the check bits form a codeword of the error code or are part of such a codeword.

Linear codes are considered in exemplary fashion below as error codes. An error code can be described as a linear code by an H-matrix, for example, an (m,n) matrix being able to be used as an H-matrix for an error code of length n having m check bits.

The H-matrix determines for example a syndrome generator that determines error syndromes for errors that occur.

On the basis of the error syndromes, the applicable errors can be corrected and/or detected by using a combinatorial circuit, for example. By way of example, bit positions to be corrected may be associated with the error syndromes on the basis of a combinatorial circuit.

The H-matrix can be used to determine a method for correcting 1-bit errors and adjacent 2-bit errors and for detecting nonadjacent 2-bit errors.

If the H-matrix has m rows and n columns, this determines an error code having m check bits. The length of the error code is equal to the number n of columns of the H-matrix.

The H-matrix of the error code is an (m, n) matrix and can be described as $$H = (h^1, h^2, \ldots, h^n) = \begin{pmatrix} h_1^1 & h_1^2 & \ldots & h_1^n \\ \vdots & \vdots & \ldots & \vdots \\ h_m^1 & h_m^2 & \ldots & h_m^n \end{pmatrix}, \quad (1)$$

where h1, h2, hn denote the n columns of the H-matrix, which each have m binary components.

If v=v1, . . . , vn is a code vector (also referred to as a codeword) of the error code under consideration, then $$H \cdot v = 0. \quad (2)$$

If v' is a vector where $$v' = v + e = v_1 + e_1, v_2 + e_2, \ldots, v_n + e_n,$$

then $$H \cdot v' = H \cdot (v + e) = H \cdot e = s. \quad (3)$$

In this case, the vector e=e1, . . . , en denotes an error vector describing a possible deviation of the erroneous vector v' from the correct vector v. The vector v' is therefore the disturbed or erroneous (code) vector.

The vector v' differs from the vector v in the components in which the applicable components of the error vector e are equal to 1, and the vector v' does not differ from the vector v in the components in which the components of the error vector e are equal to 0.

If, for example for i∈{1, . . . , n}, the i-th component ei of the error vector e is equal to 1, the i-th bit vi of the vector v has been disturbed by an error in the i-th bit $$v'_i = v_i + 1$$

of the vector v'. If for example the j-th component ej of the error vector e is equal to 0, then the j-th bit of the vector v has not been disturbed by an error of the vector v', and: v'j=vj.

If precisely one component of the error vector e is equal to 1, then there is a 1-bit error. If precisely two components of the error vector e are equal to 1, then there is a 2-bit error. If precisely two components of the error vector that are equal to 1 are adjacent, then there is an adjacent 2-bit error. If precisely two components of the error vector are equal to 1 that are not adjacent, then there is a nonadjacent 2-bit error.

The operation "+" denotes modulo 2 addition or the logic XOR operation (XOR stands for Exclusive-Or).

If a vector is arranged to the right of a matrix, then it must be interpreted as a column vector. If the aim is to highlight that the vector v is represented as a column vector, then this can be expressed by vT.

Equation (3) defines an error syndrome s. The error syndrome s is represented in equation (3) as a column vector sT=[s1, . . . , sm]T having m components s1, . . . , sm.

In accordance with the elements of the H-matrix, the components s1, . . . , sn of the error syndrome s are determined by $$s_1 = h_1^1 \cdot v_1' + h_1^2 \cdot v_2' + \ldots + h_1^n \cdot v_n', \quad (4)$$

$$s_2 = h_2^1 \cdot v_1' + h_2^2 \cdot v_2' + \ldots + h_2^n \cdot v_n', \quad (5)$$

$$\vdots$$

$$s_m = h_m^1 \cdot v_1' + h_m^2 \cdot v_2' + \ldots + h_m^n \cdot v_n', \quad (6)$$

An implementation of equations (4) to (6) to determine the components s1 to sm of the error syndrome s can also be referred to as the syndrome generator. An implementation of these equations can be achieved by means of a standard synthesis tool, for example.

If all 1-bit errors are corrected by using an error syndrome of an error code, all 1-bit errors are distinguishable on the basis of the error syndrome and the error syndromes of the different 1-bit errors are different in pairs. The different error syndromes of the n possible 1-bit errors are then equal to the n columns h1 to hn of the H-matrix according to equation (1). In this case, the H-matrix is determined such that all n columns are different in pairs.

If all 1-bit errors and all, including nonadjacent, 2-bit errors are corrected by using an error syndrome of an error code, then all error syndromes of the n different 1-bit bit errors and all error syndromes of the $$\binom{n}{2}$$

different 2-bit errors are different in pairs. The different error syndromes of the n possible 1-bit errors are then equal to the n columns h1 to hn of the H-matrix according to equation (1), and the error syndromes of the $$\binom{n}{2}$$

different 2-bit errors are then equal to the component-by-component XOR sums of the $$\binom{n}{2}$$

different combinations of two columns of this H-matrix.

A known 2-bit-error-correcting code is a 2-bit-error-correcting BCH code that allows all 1-bit errors and all 2-bit errors to be corrected. A 2-bit-error-correcting BCH code for correcting any 1-bit errors and any 2-bit errors is described in [Rao, T.; Fujiwara, E.: "Error Control codes for Computer Systems", Prentice Hall 1989, pages 97 to 99], for example, which is hereby incorporated by reference in its entirety.

For a 2-bit-error-correcting BCH code, all columns of the applicable H-matrix and all component-by-component XOR sums of all pairs of columns of the H-matrix need to be different in pairs. The number m of the components of the error syndrome, which is equal to the number of check bits of the error code, then needs to be at least of such a magnitude that $$2^m \geq n + \binom{n}{2}.$$

This is necessary so that all errors to be corrected correspond to different error syndromes and can be distinguished on the basis of their error syndromes. The number m of components of the error syndrome is equal to the number of check bits of the error code in this case.

For a known 2-bit-error-correcting BCH code of length n, the number m of the at least necessary check bits is equal to the smallest positive whole number that is greater than 2·log 2 n, that is to say that in this case $$m > 2 \cdot \log_2 n.$$

If the aim is to correct only the 1-bit errors and the adjacent 2-bit errors by using an error code, then it may be disadvantageous if all $$n + \binom{n}{2}$$

error syndromes for 1-bit errors and for any 2-bit errors are different in pairs, as is the case for the 2-bit-error-correcting BCH code, because this could require more check bits than for correcting the 1-bit errors, for correcting adjacent 2-bit errors and for detecting nonadjacent 2-bit errors.

The limitation that nonadjacent 2-bit errors are merely supposed to be detected but do not need to be corrected means that the number of check bits needed can be reduced.

This is advantageous in particular because memory cells are also needed for the check bits.

In particular, it is proposed that the n+n−1 error syndromes for the n possible 1-bit errors and for n−1 adjacent 2-bit errors are different in pairs and that the error syndromes of all nonadjacent 2-bit errors are only different from the error syndromes of the 1-bit errors and from the error syndromes of the adjacent 2-bit errors.

There is thus a first group of error syndromes for 1-bit errors and a second group of error syndromes for adjacent 2-bit errors. The error syndromes of the first group need to differ from one another and the error syndromes of the second group need to differ from one another and from the error syndromes of the first group. Furthermore, there is a third group of error syndromes for nonadjacent 2-bit errors; the error syndromes that the third group contains need only be different from the error syndromes of the first group and the second group, but the error syndromes of the third group do not need to be different from one another.

Error syndromes of pairs of different nonadjacent 2-bit errors may be equal to one another in this example. If error syndromes of different pairs of nonadjacent 2-bit errors are equal to one another, then this allows the number of error syndromes needing to be distinguished to be reduced such that fewer check bits are necessary than for a 2-bit-error-correcting BCH code.

Therefore, it is in particular an advantage of the approach described here to allow correction of 1-bit errors and of adjacent 2-bit errors and to detect errors in nonadjacent 2-bit errors, the intention being for as few check bits as possible to be used for this.

The number of check bits for an H-matrix is then smaller than the number of check bits for an H-matrix of a 2-bit-error-correcting BCH code having the same number of columns. Accordingly, a syndrome generator resulting there-from has fewer outputs than a corresponding syndrome generator for the 2-bit-error-correcting BCH code.

In particular, a method for correcting 1-bit errors and adjacent 2-bit errors and for detecting nonadjacent 2-bit errors in particular when reading bits stored in memory cells is proposed. The method uses an error code determined by an H-matrix. This H-matrix is described in exemplary fashion below.

In this case, it should be mentioned that the H-matrix is used as an exemplary notation to describe any linear error code. The H-matrix is then used to illustrate the properties that the error code needs to have in order to be able to be used for the aforementioned correction and detection. Theoretically, other forms of description are possible instead of the H-matrix. In other words: it is possible for any linear error code that has the properties demanded here, namely being able to correct 1-bit errors and adjacent 2-bit errors and detect nonadjacent 2-bit errors, to be mapped onto an H-matrix having the properties described here. Therefore, the H-matrix is a unique reference for the error codes proposed herein.

The H-matrix can have multiple H-matrices. By way of example, an H-matrix may be determined such that special H-matrices are provided for specific numbers of rows and columns and that further H-matrices are derived from the provided H-matrices for further numbers of rows and columns. Further H-matrices can also be derived by deleting columns, for example last or first columns, from already existent H-matrices.

H-matrices are specified in exemplary fashion below for
m=6 and n=11,
m=7 and n=14 and
m=8 and n=26,
where n indicates the number of columns and m indicates the number of rows of the H-matrix.

Example of an H-matrix H6,11

If m=6 and n=11, then equation (7) shows an example of a special H-matrix H6,11

$$H^{6,11} = \begin{pmatrix} 1 & 0 & 0 & 0 & 0 & 0 & 1 & 1 & 1 & 1 & 0 \\ 0 & 1 & 0 & 0 & 0 & 0 & 1 & 1 & 1 & 0 & 1 \\ 0 & 0 & 1 & 0 & 0 & 0 & 1 & 1 & 0 & 1 & 1 \\ 0 & 0 & 0 & 1 & 0 & 0 & 1 & 0 & 1 & 1 & 1 \\ 0 & 0 & 0 & 0 & 1 & 0 & 0 & 1 & 1 & 1 & 1 \\ 0 & 0 & 0 & 0 & 0 & 1 & 1 & 0 & 1 & 0 & 1 \end{pmatrix} = (h_1, h_2, \ldots, h_{11}) \quad (7)$$

of an error code C6,11 having 6 rows, i.e. m=6 check bits, and n=11 columns (and hence n−m=5 data bits). The length of the error code C6,11 is n=11.

The smallest whole number that is greater than $$\log_2 n = \log_2 11$$

is 4, because $$2^3 = 8 < 11 < 2^4 = 16.$$

The number of rows m=6 of the H-matrix H6,11 is less than the number 2·4=8 of rows of a 2-bit-error-correcting BCH code of length 11.

Calculation can be used to check that the H-matrix H6,11 is determined such that all 11 columns h1 to h11 and all component-by-component XOR sums of the n−1=10 pairs of adjacent columns $$h_1 + h_2 = [110000]^T,$$
$$h_2 + h_3 = [011000]^T,$$
$$\vdots$$
$$h_{10} + h_{11} = [110001]^T$$

are different in pairs. They are also different from the component-by-component XOR sums of the $$\binom{11}{2} - 10 = 45;$$

pairs of nonadjacent columns $$h_1 + h_3 = [101000]^T,$$
$$h_1 + h_4 = [100010]^T,$$
$$\vdots$$
$$h_9 + h_{11} = [101000]^T.$$

In this case, $[110000]^T$ denotes a column vector having the components 1,1,0,0,0,0. This applies accordingly to the other column vectors.

XOR sums of two different pairs of nonadjacent columns may be equal in this case. As such, for example $$h_1 h_3 = h_9 +_{11} = [101000]^T.$$

The 11 columns h1 to h11 are equal to the syndromes of applicable 1-bit errors, and the 10 XOR sums of the adjacent columns $h_1+h_2$, $h_2+h_3$, $h_3+h_4$, $h_4+h_5$, $h_5+h_6$, $h_6+h_7$, $h_7+h_8$, $h_8+h_9$, $h_9+h_{10}$, $h_{10}+h_{11}$, are equal to the syndromes of the 10 possible adjacent 2-bit errors.

The H-matrix H6,11 is in this case determined such that the 10 error syndromes of the 10 adjacent 2-bit errors are different in pairs, that they are different from all 11 error syndromes of the 1-bit errors and different from all $$\binom{11}{2} - 10 = 45;$$

nonadjacent 2-bit errors.

Any 1-bit error and any adjacent 2-bit error can then be explicitly identified and corrected on the basis of its error syndrome.

The error syndromes of nonadjacent 2-bit errors differ from the error syndromes of adjacent 2-bit errors and from the error syndromes of the 1-bit errors.

Since error syndromes of different nonadjacent 2-bit errors may be equal, nonadjacent 2-bit errors cannot be explicitly corrected. This is also not necessary in the present example and advantageously leads to fewer check bits being needed than in the case of a 2-bit-error-correcting BCH code.

The error code C6,11 is therefore a code of length 11 that has 6 check bits and 5 data bits, that can correct 1-bit errors and adjacent 2-bit errors and that can detect nonadjacent 2-bit errors.

By contrast, a known 2-bit-error-correcting BCH code having 6 check bits is a code having the maximum length 7 and has only 1 data bit. Therefore, the length of the BCH code is shorter for the same number of check bits. With a length of 11, the 2-bit-error-correcting BCH code requires a number of 8 check bits. Therefore only 3 data bits remain.

The H-matrix H6,11 can be used to determine a syndrome generator.

An error-free codeword (code vector) referred to is $v=[v_1, \ldots, v_{11}]$, and an erroneous, disturbed codeword (erroneous code vector) referred to is $v'=[v'_1, \ldots, v'_{11}]$ where $v'=v+e=v_1+e_1, \ldots, v_{11}+e_{11}$.

In this case, $e=e1, e11$ is the error vector. The modulo 2 addition or the logic XOR operation is denoted by +.

If a component of the error vector e is equal to 1, then the applicable component of the vector v' is erroneous; if a component of the error vector e is equal to 0, then the applicable component of the vector v' is not erroneous The error syndrome s is determined according to $s=[s_1, \ldots, s_{11}]=H^{6,11} \cdot v'$. (8)

This is obtained by multiplying the H-matrix H6,11 by the column vector v'. The vector v' in equation (8) is a column vector.

The components of the error syndrome s can be specified as follows $s_1 = v'_1 v'_7 + v'_8 + v'_9 + v'_{10}$, (9)

$s_2 = v'_2 v'_7 + v'_8 + v'_9 + v'_{11}$, (10)

$s_3 = v'_3 v'_7 + v'_8 + v'_{10} + v'_{11}$, (11)

$s_4 = v'_4 v'_7 + v'_9 + v'_{10} + v'_{11}$, (12)

$s_5 = v'_5 v'_8 + v'_9 + v'_{10} + v'_{11}$, (13)

$s_6 = v'_6 + v'_7 + v'_9 + v'_{11}$. (14)

The error detection and error correction using an error syndrome are known to a person skilled in the art. As such, the error correction can be effected for example by using a syndrome table (also referred to as "syndrome decoding table"). The syndrome table is a table describing a bijective association between the error vectors of the errors to be corrected and their bijectively corresponding error syndromes. The association between error syndromes and error vectors that is described by the syndrome table can be realized by a combinatorial circuit, for example. The components of the error syndrome are then applied to the inputs of the combinatorial circuit, the outputs of which output the components of the applicable error vector. The components e1 to en of the error vector e that are provided by the combinatorial circuit can be XORed with the applicable components v'1 to v'n of the possibly erroneous code vector v' that is to be corrected, for example, in order to form the corrected values.

An example of a syndrome table is depicted in [Wickert, S. B.: "Error Control for Digital Communication and Storage", Prentice Hall 1995, page 89], for example, which is hereby incorporated by reference.

Example of an H-matrix H7,14

For m=7 and n=14, equation (15) shows a further example of an H-matrix H7,14

$$H^{7,14} = \begin{pmatrix} 1 & 0 & 0 & 0 & 0 & 0 & 0 & 1 & 1 & 1 & 1 & 1 & 0 & 1 \\ 0 & 1 & 0 & 0 & 0 & 0 & 0 & 1 & 1 & 1 & 1 & 0 & 1 & 0 \\ 0 & 0 & 1 & 0 & 0 & 0 & 0 & 1 & 1 & 1 & 0 & 1 & 1 & 1 \\ 0 & 0 & 0 & 1 & 0 & 0 & 0 & 1 & 1 & 0 & 1 & 1 & 1 & 0 \\ 0 & 0 & 0 & 0 & 1 & 0 & 0 & 1 & 0 & 1 & 1 & 1 & 1 & 1 \\ 0 & 0 & 0 & 0 & 0 & 1 & 0 & 0 & 1 & 1 & 1 & 1 & 1 & 0 \\ 0 & 0 & 0 & 0 & 0 & 0 & 1 & 1 & 0 & 1 & 0 & 1 & 0 & 1 \end{pmatrix} = (h_1, h_2, \ldots, h_{14})$$ (15)

of an error code C7,14 having 7 rows, i.e. m=7 check bits, and n=14 columns (and hence n−m=7 data bits). The length of the error code C7,14 is n=14.

The H-matrix H7,14 is for example determined such that all 14 columns h1 to h14 and all component-by-component XOR sums of the 13 pairs of adjacent columns $h_1 + h_2$, $\vdots$ $h_{13} + h_{14}$ are different in pairs. They are determined such that they are also different from the component-by-component XOR sums of the $\binom{14}{2} - 13 = 78$ pairs of nonadjacent columns $h_1 + h_3$, $h_1 + h_4$, $\vdots$ $h_{12} + h_{14}$.

XOR sums of two different pairs of nonadjacent columns can be equal in this case.

The 14 columns h1 to h14 are equal to the syndromes of applicable 1-bit errors, and the 13 XOR sums of the adjacent columns $h_1 + h_2$, $h_2 + h_3$, $h_3+h_4$, $h_4+h_5$, $h_5+h_6$, $h_6+h_7$, $h_7+h_8$, $h_8+h_9$, $h_9+h_{10}$, $h_{10}+h_{11}$, $h_{11}+h_{12}$, $h_{12}+h_{13}$, $h_{13}+h_{14}$, are equal to the syndromes of the 13 possible adjacent 2-bit errors. The H-matrix H7,14 is determined such that error syndromes are different in pairs. Any 1-bit error and any adjacent 2-bit error can be explicitly identified and corrected on the basis of its error syndrome.

The error syndromes of nonadjacent 2-bit errors differ from the error syndromes of adjacent 2-bit errors and from the error syndromes of the 1-bit errors.

Since error syndromes of different nonadjacent 2-bit errors can be equal, nonadjacent 2-bit errors cannot be explicitly corrected.

As such, for example:

$h_8 h_{12}=[1111101]^T+[1011111]^T[0100010]^T=$ $h_2+h_6=[0100000]^T+[0000010]^T.$

Therefore, a 2-bit error in the 8th and the 12th bit is not distinguishable from a 2-bit error in the 2nd and the 6th bit.

The error code C7,14 is therefore a code of length 14 that has 7 check bits and 7 data bits, that can correct 1-bit errors and adjacent 2-bit errors and that can detect nonadjacent 2-bit errors.

By contrast, a known 2-bit-error-correcting BCH code, if it has a length of 14, has 8 check bits and only 6 data bits. A 2-bit-error-correcting BCH code of equal length thus requires more check bits.

The smallest whole number that is greater than $\log_2 n = \log_2 14$ is again 4 (see explanations above). The number of m=7 rows of the H matrix H7,14 is less than the number of 2·4=8 rows of a 2-bit-error-correcting BCH code of length 14.

Analogously to what has been explained above for the syndrome components s1, ..., s6 of the H-matrix H6,11, the syndrome equations for the syndrome components s1, ..., s7 are determined from the H-matrix H7,17 according to equation (15).

Example of an H-matrix H8,26

For m=8 and n=26, equation (16) shows a further example of an H-matrix H8,26

$$h^{8,26} = (h_1, h_2, \ldots, h_{25}, h_{26}) = \begin{pmatrix} 1 & 0 & 0 & 0 & 0 & 0 & 0 & 1 & 1 & 1 & 1 & 1 & 1 & 0 & 1 & 1 & 0 & 1 & 1 & 1 & 0 & 0 & 0 & 1 & 1 \\ 0 & 1 & 0 & 0 & 0 & 0 & 0 & 0 & 1 & 1 & 1 & 1 & 1 & 0 & 1 & 0 & 0 & 1 & 1 & 0 & 0 & 1 & 1 & 1 & 1 & 0 \\ 0 & 0 & 1 & 0 & 0 & 0 & 0 & 0 & 1 & 1 & 1 & 1 & 0 & 1 & 1 & 1 & 1 & 1 & 0 & 1 & 0 & 1 & 0 & 0 & 1 \\ 0 & 0 & 0 & 1 & 0 & 0 & 0 & 0 & 1 & 1 & 1 & 0 & 1 & 1 & 1 & 1 & 1 & 0 & 1 & 0 & 1 & 0 & 1 & 1 & 0 \\ 0 & 0 & 0 & 0 & 1 & 0 & 0 & 0 & 1 & 1 & 0 & 1 & 1 & 1 & 1 & 0 & 0 & 1 & 0 & 1 & 1 & 1 & 1 & 0 & 0 \\ 0 & 0 & 0 & 0 & 0 & 1 & 0 & 0 & 1 & 0 & 1 & 1 & 1 & 1 & 0 & 1 & 1 & 0 & 0 & 1 & 1 & 1 & 0 & 1 & 1 \\ 0 & 0 & 0 & 0 & 0 & 0 & 1 & 0 & 0 & 1 & 1 & 1 & 1 & 1 & 1 & 1 & 0 & 1 & 1 & 1 & 1 & 0 & 1 & 1 & 0 \\ 0 & 0 & 0 & 0 & 0 & 0 & 0 & 1 & 1 & 0 & 1 & 0 & 1 & 0 & 1 & 1 & 0 & 0 & 1 & 1 & 1 & 0 & 0 & 1 & 0 & 1 \end{pmatrix} \quad (16)$$

of an error code C8,26 having 8 rows, i.e. m=8 check bits, and n=26 columns. The length of the error code C8,26 is n=26. The error code C8,26 has (26−8=) 18 data bits.

If only 16 data bits are required, then for example the last two columns h25 and h26 of the H-matrix H8,26 can be deleted so as to obtain an H-matrix H8,24

$H^{8,24}=(h_1,h_2\ldots,h_{23},h_{24})$ having 24 columns.

Calculation can be used to check that the H-matrix H8,26 is determined such that all 26 columns h1 to h26 and all component-by-component XOR sums of the 25 pairs of adjacent columns $h_1 + h_2$, $h_2 + h_3$, $\vdots$ $h_{25} + h_{26}$ are different in pairs.

Furthermore, the $\binom{26}{2} - 25 = 3001$

XOR sums of all pairs of nonadjacent columns are not equal to all columns and not equal to all component-by-component XOR sums of the adjacent columns.

The component-by-component XOR sums of nonadjacent columns may be identical, on the other hand. By way of example:

$h_5+h_7=[00001000]^T+[00000010]^T=[00001010]^T=$ $h_9+h_{11}=[11111101]^T+[11110111]^T.$

Therefore, a 2-bit error in the 5th and the 7th bit is not distinguishable from a 2-bit error in the 9th and 11th bits.

The smallest whole number that is greater than $\log_2 n = \log_2 26$ is 5, because $2^4=16<26<2^5=32.$ The number m=8 rows of the H-matrix H8,26 is less than the number of 2·5=10 rows of a 2-bit-error-correcting BCH code of length 26.

An error-free codeword of length n=26 is denoted by $$v=[v_1, \ldots, v_{26}]$$

and an erroneous, disturbed codeword is denoted by $$v'=[v'_1, \ldots, v'_{26}]=v+e=v_1+e_1, \ldots, v_{26}e_{26},$$

where e=e1, . . . , e26 is the error vector.
The error syndrome s is determined according to $$s=[s_1, \ldots, s_{26}]=H^{8,26} \cdot v'. \quad (17)$$

The components of the error syndrome s are obtained from the rows of the H-matrix H8,26 and the components of the disturbed codeword v'=v'1, . . . , v'26. As such, for example for the first component s1 of the error syndrome in accordance with the first row [10000000111110110111100011] of the H-matrix H8,26, $$s_1=v'_1 v'_9+v'_{10}+v'_{11}+v'_{12}+v'_{13}+v'_{14}+v'_{16}+v'_{17}+v'_{19}+ v'_{20}+v'_{21}+v'_{25}+v'_{26}. \quad (18)$$

The components s2 to s8 of the error syndrome result in analogous fashion on the basis of the 2nd to 8th rows of the H-matrix H8,26 and the components of the disturbed codeword v'.

An implementation of the components s1 to s8 of the error syndrome s allows a syndrome generator of the error code to be determined.

Exemplary embodiment: generation of further H-matrices

An exemplary embodiment of how a first H-matrix Hm,n having m rows and n columns can be taken as a basis for determining a second H-matrix Hm+2,2·n+1 having m+2 rows and 2·n+1 columns will be described below. The applicable error code Cm+2,2·n+1 then has m+2 check bits. The length of the code is 2·n+1, and there are 2·n−m−1 data bits present.

As an example, m=8 and n=26 and the H-matrix $$H^{8,26}=(h_1, h_2, \ldots, h_{25}, h_{26}), \quad (19)$$

according to equation (16) are chosen.

The first H-matrix H8,26 according to equation (16) can be used to determine a second H-matrix H10,53 according to $$H^{10,53} = \begin{pmatrix} h_1 & h_2 & \ldots & h_{25} & h_{26} & h_{zw} & h_1 & h_2 & \ldots & h_{25} & h_{26} \\ 0 & 0 & \ldots & 0 & 0 & 0 & 1 & 1 & \ldots & 1 & 1 \\ 0 & 0 & \ldots & 0 & 0 & 1 & 1 & 0 & \ldots & 1 & 0 \end{pmatrix} \quad (20)$$

In this case, a column hzw is inserted as a column vector $$h_{zw} = \underbrace{[0, \ldots, 0]}_{8}^T$$

having 8 components. The column vector hzw can also be referred to as an intermediate column that is inserted between the two H-matrices H8,26.

In general, the second matrix can be determined as follows:

The original matrix Hm,n is duplicated, wherein the intermediate column hzw having m zeroes is inserted between the original matrix and the duplicate matrix.

The original matrix can have two rows comprising n zeroes each added to it.

The duplicate matrix can have one row comprising n ones and a further row added to it. The further row is determined by $$\underbrace{1010 \ldots 10}_{n},$$

if n is even, or the further row is determined by $$\underbrace{1010 \ldots 1}_{n},$$

if n is odd.

The intermediate column hzw comprising m zeroes has one column [0,1]T added to it.

In the example above, m=8 and n=26 have been chosen. The H-matrix Hm,n can therefore be taken as a basis for determining the H-matrix Hm+2,2·n+1. Accordingly, the H-matrix Hm+2,2·n+1 can be used to determine an H-matrix Hm+4,4·n+3. This approach can be continued for further H-matrices accordingly.

For a number of for example 6, 7 or 8 check bits, H-matrices for determining a syndrome generator can be ascertained directly. For a larger number of check bits, for example for 10, 12, 14 or more check bits, H-matrices for determining syndrome generators can be determined from H-matrices already determined beforehand having a smaller number of check bits. For the purpose of matching to a different length of codewords, first columns and/or last columns of an H-matrix ascertained in this manner can be deleted.

Modifications of H-matrices can also be made by virtue of linear combinations of their rows, for example.

H-matrices can also be modified by interchanging their columns, for example.

One option is that the error code described herein can be combined with other (e.g. including already known) error codes. By way of example, in particular an H-matrix of a BCH code may be part of the H-matrix described here.

Error Processing

FIG. 1 shows an exemplary arrangement to illustrate the processing of data by means of error codes.

First of all, a payload 101 is applied to a coding unit 102. The coding unit 102 uses an error code in order to store the payload 101 in a memory 104 in the form of codewords 103. Each codeword 103 comprises data bits and check bits.

In exemplary fashion, read access is now effected to the memory 104. A decoding unit 106 obtains a possibly erroneous codeword 105 as a result. The decoding unit 106 performs correction of a 1-bit error or of a 2-bit error in adjacent read memory cells (and hence adjacent bit positions) or detects a 2-bit error at nonadjacent memory cells.

Therefore, an error-free, possibly corrected, payload 107 is output that is identical to the payload 101 if no error or a 1-bit error or an adjacent 2-bit error has been detected. It is also possible for the decoding unit 106 to output an error indicating that a 2-bit error has been detected in nonadjacent memory cells.

The invention claimed is:
1. A method, comprising:
   identifying data to be processed;
   processing the identified data using an error code with a processing circuit to:

correct 1-bit errors,
correct adjacent 2-bit errors, and
detect nonadjacent 2-bit errors,
outputting the processed identified data when the identified data, upon processing, contains a corrected 1-bit error or a corrected adjacent 2-bit error; and
outputting an error indication indicating that the identified data, upon processing, contains a nonadjacent 2-bit error,
wherein the error code comprises an H-matrix with n columns and m rows,
wherein the columns of the H-matrix are different,
wherein component-by-component XOR sums of adjacent columns of the H-matrix are different from one another and from all columns of the H-matrix, and
wherein component-by-component XOR sums of nonadjacent columns of the H-matrix are different from all columns of the H-matrix and from all component-by-component XOR sums of adjacent columns of the H-matrix.

2. The method as claimed in claim 1, wherein a number of all components of a column of the H-matrix is less than the smallest whole number that is greater than $2 \cdot \log_2 n$.

3. The method as claimed in claim 1, wherein the error code is an error-detecting code, or an error-correcting and error-detecting code.

4. The method as claimed in claim 1, wherein at least two component-by-component XOR sums of nonadjacent columns of the H-matrix are not different.

5. The method as claimed in claim 1, wherein the error code has a length of n bits with m check bits and n-m payload bits.

6. The method as claimed in claim 1, further comprising determining a syndrome generator for forming an m-component error syndrome in accordance with the H-matrix.

7. The method as claimed in claim 6, wherein the syndrome generator is implemented as a combinatorial circuit having n inputs and m outputs.

8. The method as claimed in claim 6, further comprising forming correction values for erroneous bit positions using a correction value formation unit that uses the m-component error syndrome provided by the syndrome generator.

9. The method as claimed in claim 1, wherein the H-matrix is part of an extended H-matrix.

10. The method as claimed in claim 9, wherein the extended H-matrix is determined by:
duplicating the H-matrix into an original H-matrix and a duplicate H-matrix, wherein an intermediate column having m zeroes is inserted between the original H-matrix and the duplicate H-matrix,
wherein the original H-matrix has two rows having n zeroes added to it,
wherein the duplicate H-matrix has one row having n ones and a further row added to it, wherein the further row is determined by:
a bit combination comprising n bits according to 1010 . . . 10, if n is even-numbered,
or
a bit combination comprising n bits according to 1010 . . . 1, if n is odd-numbered, and
wherein the intermediate column comprising m zeroes has one column $[0,1]^T$ added to it.

11. The method as claimed in claim 1, wherein the H-matrix is adapted by deleting at least one first column and/or at least one last column.

12. The method as claimed in claim 1, wherein the H-matrix is modified by a linear combination of its rows.

13. The method as claimed in claim 1, wherein the processing of the data comprises writing to a memory or reading from a memory.

14. An apparatus for processing data using an error code, wherein the error code has an H-matrix with n columns and m rows, wherein the apparatus comprises:
a memory circuit comprising instructions; and
a processing circuit that is configured to retrieve and execute the instructions, and upon execution of the instructions the processing circuit is configured to:
determine the error code in accordance with the H-matrix, and
use the determined error code to process identified data to:
correct 1-bit errors,
correct adjacent 2-bit errors, and
detect nonadjacent 2-bit errors,
output the processed identified data when the identified data, upon processing, contains a corrected 1-bit error or a corrected adjacent 2-bit error; and
output an error indication indicating that the identified data, upon processing, contains a nonadjacent 2-bit error,
wherein the columns of the H-matrix are different,
wherein component-by-component XOR sums of adjacent columns of the H-matrix are different from one another and from all columns of the H-matrix, and
wherein component-by-component XOR sums of nonadjacent columns of the H-matrix are different from all columns of the H-matrix and from all component-by-component XOR sums of adjacent columns of the H-matrix.

15. The apparatus as claimed in claim 14, wherein the processing circuit comprises a syndrome generator configured to output syndromes based on the H-matrix.

16. The apparatus as claimed in claim 14, wherein the processing of the data comprises writing to the memory circuit or reading from the memory circuit.

17. The apparatus as claimed in claim 14, wherein a number of all components of a column of the H-matrix is less than the smallest whole number that is greater than $2 \cdot \log_2 n$.

18. The apparatus as claimed in claim 14, wherein at least two component-by-component XOR sums of nonadjacent columns of the H-matrix are not different.

\* \* \* \* \*